United States Patent

Salvin et al.

[11] Patent Number: 6,045,972
[45] Date of Patent: Apr. 4, 2000

[54] COATING METHOD USING AQUEOUS PHOTOPOLYMERIZABLE COMPOSITIONS

[75] Inventors: Roger Pierre-Elie Salvin, Weil am Rhein, Germany; Martin Roth, Giffers, Switzerland

[73] Assignee: Ciba Specialty Chemicals Corp., Tarrytown, N.Y.

[21] Appl. No.: 09/320,919

[22] Filed: May 27, 1999

Related U.S. Application Data

[62] Division of application No. 08/714,633, Sep. 13, 1996, Pat. No. 5,942,371, which is a continuation of application No. 08/514,342, Aug. 10, 1995, abandoned, which is a continuation of application No. 08/268,092, Jun. 28, 1994, abandoned.

[30] Foreign Application Priority Data

Jul. 2, 1993 [CH] Switzerland .............................. 2005/93

[51] Int. Cl.$^7$ ................ G03C 1/73; G03C 5/00
[52] U.S. Cl. .................... 430/280.1; 430/281.1; 430/286.1; 430/287.1; 430/311; 430/325
[58] Field of Search .............. 430/280.1, 281.1, 430/286.1, 287.1, 311, 325; 522/16, 39, 85, 103

[56] References Cited

U.S. PATENT DOCUMENTS

| | | | |
|---|---|---|---|
| 4,933,259 | 6/1990 | Chihara et al. | 430/280.1 |
| 4,948,700 | 8/1990 | Maeda et al. | 430/280.1 |
| 5,045,435 | 9/1991 | Adams et al. | 430/288.1 |
| 5,153,101 | 10/1992 | Meier et al. | 430/281.1 |
| 5,286,611 | 2/1994 | Meier et al. | 430/325 |
| 5,501,942 | 3/1996 | Salvin et al. | 430/280.1 |
| 5,538,821 | 7/1996 | Kakinuma et al. | 430/18 |
| 5,942,371 | 8/1999 | Salvin et al. | 430/280.1 |

FOREIGN PATENT DOCUMENTS

| | | |
|---|---|---|
| 0302827 | 2/1989 | European Pat. Off. . |
| 0493317 | 7/1992 | European Pat. Off. . |
| 04294352 | 3/1991 | Japan . |
| 1187652 | 3/1967 | United Kingdom . |

OTHER PUBLICATIONS

Derwent Abstr. 92–394823.

*Primary Examiner*—Bernard Codd
*Attorney, Agent, or Firm*—Michele A. Kovaleski

[57] ABSTRACT

The claimed invention relates to a method for coating a substrate, preferably a printed circuit board, comprising the step of applying to said substrate surface a photopolymerizable water-borne aqueous-alkaline developable coating composition. The novel composition comprises a certain film-forming, acid group-containing acrylated derivative of an epoxy resin which is sufficiently neutralized with ammonia or an amine or an inorganic base to promote the formation of the corresponding ammonium or amine or inorganic base carboxylates by a neutralization reaction; a photoinitiator; water; and, optional components; as well as one or more additional optional (meth)acrylate monomer or (meth)acrylate oligomer or a vinyl compound that can be crosslinked with light. The method produces coated substrates that are non-tacky after drying and that have good edge coverage.

12 Claims, No Drawings

COATING METHOD USING AQUEOUS PHOTOPOLYMERIZABLE COMPOSITIONS

This is a divisional of application Ser. No. 08 /714,633, filed on Sep. 13, 1996 U.S. Pat. No. 5,942,371 which is a continuation of application Ser. No. 08/514,342 filed on Aug. 10, 1995, now abandoned, which is a continuation of application Ser. No. 08/268,092 filed Jun. 28, 1994, now abandoned.

The present invention relates to novel aqueous photopolymerisable compositions, to a process for their preparation, and to the use of said novel compositions in particular for coating printed circuit boards.

Photopolymerisable compositions for use as photoresists, typically for coating printed circuit boards and for making solder masks, have long been known.

Thus, for example, EP 493 317 discloses radiation-sensitive compositions that contain polymers as binders preferably having a softening point above 80° C. as well as photopolymerisable acrylate and/or methacrylate monomers and photoinitiators, and which are aqueous applicable.

Further, U.S. Pat. No. 5045 435 discloses photoresist coating compositions comprising an acrylate monomer, a photoinitiator and, as binder, a latex of a water-insoluble carboxylated (meth)acrylate copolymer. These compositions are likewise aqueous applicable.

Such compositions accordingly contain polymolecular polymer binders and relatively low molecular acrylates and can be aqueous applicable.

Photochemically or thermally cured epoxy acrylates that are derived from low molecular epoxy resins and epoxy novolaks are known for their good thermal and mechanical properties as well as for their good resistance to aggressive chemicals. However, the tackiness and edge coverage of the resist films obtained with these systems on conductors owing to the fairly low relative molar mass are unsatisfactory. In practical application it is therefore often necessary to avoid these shortcomings by adding highly polymerised polymer binders. Such binders normally contain no functional acrylate groups and do not react concurrently during the photochemical or thermal cure, i.e. they are not incorporated as "passive" components in the network and therefore result in a dilution of the network density, which, in turn, adversely affects in particular the resistance to chemicals and the electrical properties of processed resist layers. Furthermore, the photosensitivity decreases as a consequence of the "dilution" of the acrylate groups. The addition of highly polymerised polymer binders induces high viscosity of these formulations even if the solids content is relatively low and therefore often results in serious problems in coating.

Finally, Japanese patent Kokai Hei 04-294352 discloses water-dispersible liquid resins that can be prepared by reacting an aromatic epoxy resin with an unsaturated monocarboxylic acid, then with an anhydride of an unsaturated polycarboxylic acid and finally by neutralisation with an amine, and which can be used as photosensitive compositions.

It is therefore the object of this invention to provide photopolymerisble compositions that do not have the shortcomings referred to above and, in particular, are able to function preferably without polymolecular polymer binders, and which also have less tackiness and have very good edge coverage and are aqueous applicable.

This object is achieved with a novel photopolymerisable composition comprising a) 20 to 80% by weight of a specific film-forming, acid group-containing acrylate of higher molecular weight which is neutralised with ammonia or an amine or an inorganic base, at least 10% by weight of component a) consisting of a acrylate of higher molecular weight which is derived from a reaction product of a polymolecular epoxy resin that is advanced with a bisphenol and an ethylenically unsaturated monocarboxylic acid and after subsequent reaction with a cyclic anhydride of an organic polycarboxylic acid, b) 0.1 to 15% by weight of a photoinitiator, c) 1 to 25% by weight of optional components, and d) water, as well as e) at least one additional optional (meth)acrylate monomer or (meth)acrylate oligomer or a vinyl compound that can be crosslinked with light.

Preferred compositions comprise, as component a), from 20 to 100% by weight, preferably from 40 to 100% by weight, of a polymolecular acrylic resin.

Those compositions are most preferred that contain the indicated components in the following ratios: 20 to 60% by weight of component a), 1 to 10% by weight of component b), 1 to 15% by weight of component c), and component d) to make up 100%.

Acrylates suitable for use as component a) are all known film-forming, acid group-containing polyfunctional acrylates that can be neutralised with ammonia or an amine. Suitable neutralising agents are also inorganic bases, typically sodium or potassium hydroxide.

Suitable acrylates typically include reaction products of epoxy compounds such as epoxy novolaks or epoxy resins of bisphenol A with (meth)acrylic acid and polybasic cyclic carboxylic anhydrides, as well as reaction products of polycarboxylic acids with acrylates that contain glycidyl groups or epoxy groups or with acrylates that contain hydroxyl groups.

Many of these acrylates are known and some are also commercially available. Their average molecular weight is in the range from c. 1000 to 500 000, but is preferably above 2000.

Particularly preferred acrylates, however, are those that contain an acrylated derivative of epoxy resins which are advanced with bisphenols, which derivative is reacted with a cyclic anhydride of a polycarboxylic acid, and which are disclosed in Swiss patent applications filed on Jul. 2, 1993 (application numbers 2003/93-0 and 2004/93-2, title: Epoxy acrylates). According to the disclosure of Swiss patent application 2004/93-2, particularly preferred epoxy acrylates are those of formulae II and III:

Formula II

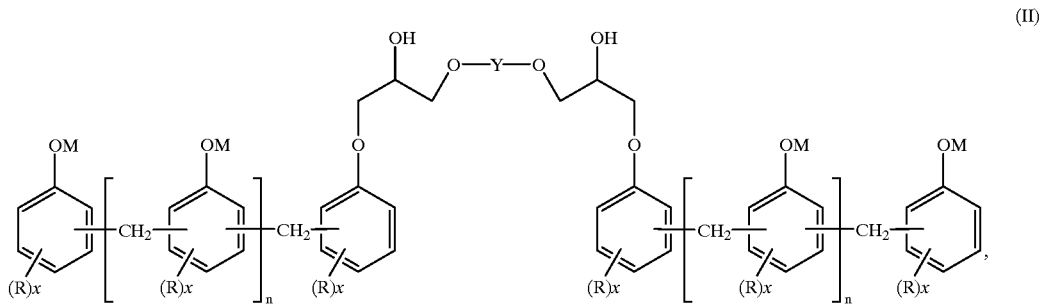

wherein
M is the group of the formula

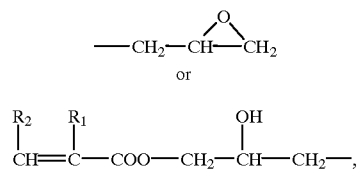

$R_1$ is —H or —$CH_3$, $R_2$ is —H, —$CH_3$ or phenyl,
R is $C_1$–$C_4$ alkyl or halogen, preferably $CH_3$ or Br,
x is an integer from 0 to 3, preferably 0 or 1, and
Y is a linking group of formula

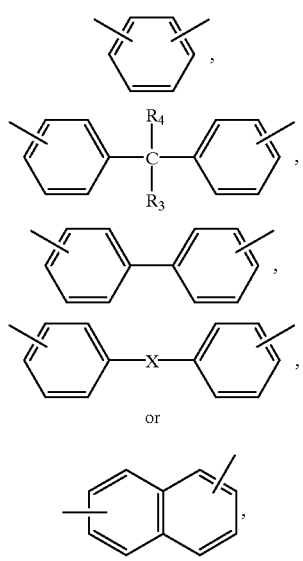

in which $R_3$ and $R_4$ are each independently of the other hydrogen or $C_1$–$C_4$alkyl, or $R_3$ and $R_4$, together with the linking carbon atom, form a 5- or 6-membered hydrocarbon ring, and the aromatic radicals of the linking group Y are unsubstituted or substituted by halogen or $C_1$–$C_4$alkyl,
X is —S—, —O—, or —$SO_2$—, and n is an integer from 0 to 300,
with the proviso that at least 10 mol % of the radicals M have the structure of formula

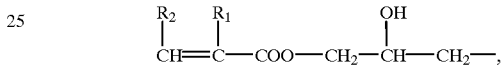

wherein $R_1$ and $R_2$ are as defined above.

Very particularly preferred epoxy acrylates have the formula II, wherein R is —H or —$CH_3$, $R_1$ is —H or —$CH_3$, $R_2$ is —H, x is 0 or 1, n is an integer from 0 to 30 and Y is a linking group of formula

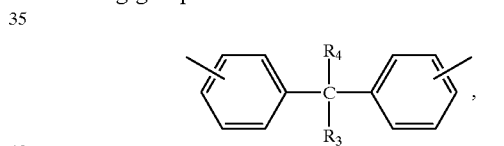

wherein
$R_3$ and $R_4$ are —H or $C_1$–$C_4$alkyl and the aromatic radicals of the linking group are unsubstituted or substituted by halogen or $C_1$–$C_4$alkyl, but preferably those wherein Y is a linking group of formula

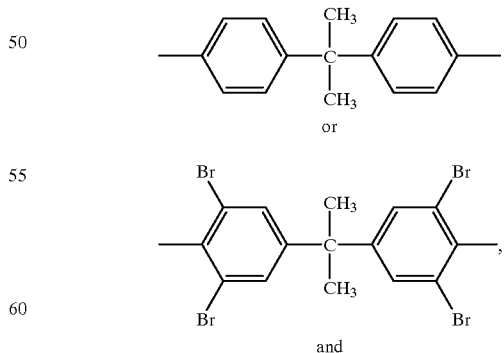

and $R_1$ is —H or —$CH_3$ and $R_2$ is —H,

Formula III

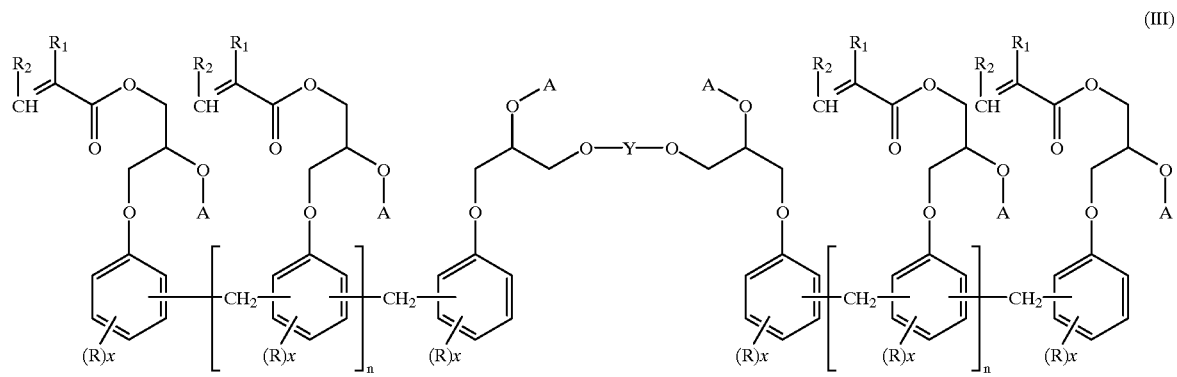

wherein

A is a hydrogen or the group formula

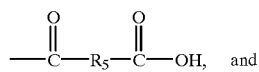

$R_1$, $R_2$, R, n, x and Y are as defined above in connection with formula II and $R_5$ is the radical of a cyclic anhydride of a polycarboxylic acid after removal of the anhydride radical, and at least 10 mol % of the radicals A have the structure of the above formula

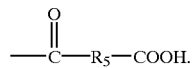

Preferred epoxy acrylates of formula III correspond to the preferred epoxy acrylates of formula II, and the symbols $R_1$, R2, R, x, n and Y in formula III have the same preferred meanings as indicated in connection with formula II.

According to the teaching of Swiss patent application 2003/13-0, particularly preferred epoxy acrylates are those of formulae IIIa) and IV:

Formula IIIa

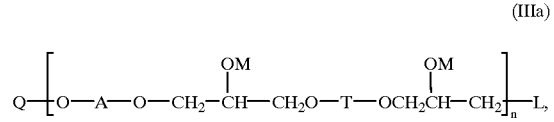

wherein

Q is hydrogen or a group of formula

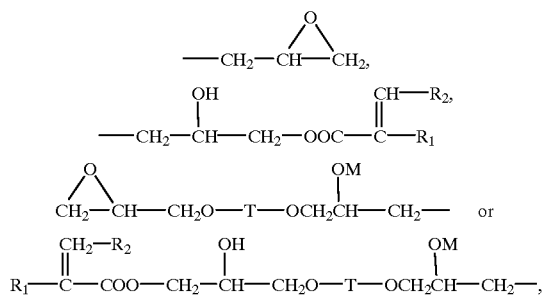

$R_1$ is —H or —$CH_3$, $R_2$ is —H, —$CH_3$ or phenyl,

T is the radical of a bifunctional aromatic compound,

M is hydrogen or a group of formula

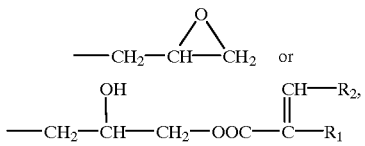

wherein $R_1$ and $R_2$ are as defined above,

A is the radical of a bifunctional aromatic compound, n is an integer from 0 to 300, and L is a group of formula

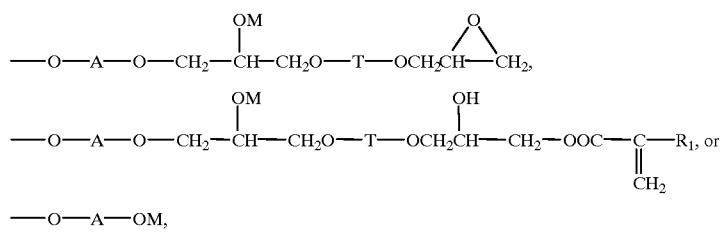

with the proviso that, in formula IIIa), not all radicals M may simultaneously be hydrogen or a group of formula

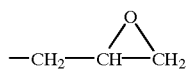

but at least 10 mol %, preferably 20–100 mol %, of radicals M that are not present in the end groups Q and L represent a group of formula

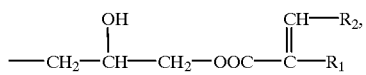

wherein $R_1$ and $R_2$ are as defined above,
but most preferably those of formula IIIa), wherein $R_1$ is hydrogen or methyl and $R_2$ is hydrogen, methyl or phenyl, and wherein n is an integer from 0 to 50 and A and T are each independently of the other a linking group of formula

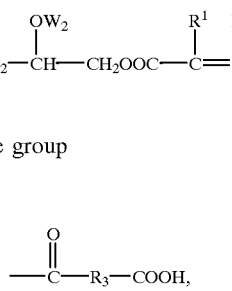

in which $R_4$ and $R_5$ are each independently of the other —H or $C_1$–$C_4$alkyl and the phenyl radicals of the linking group are unsubstituted or bromine-substituted;
carboxyl group-containing epoxy acrylates of formula IV (IV)

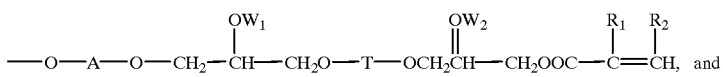

wherein
X is hydrogen or a group of formula

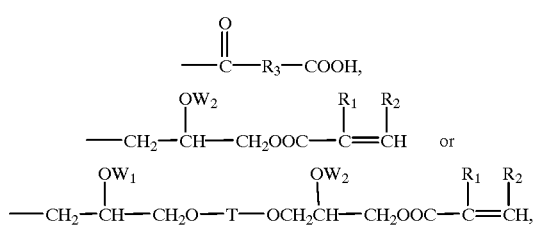

$R_3$ is the radical of a cyclic anhydride of a polycarboxylic acid after removal of the anhydride radical,
$W_1$ is hydrogen or a group of formula

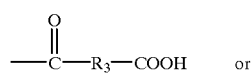 or

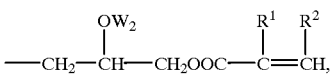

$W_2$ is —H or the group

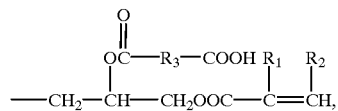

and

Y is the group of formula —O—A—O—$W_1$ or

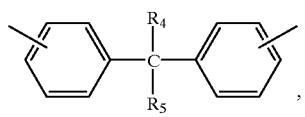

wherein the symbols A, T, $R_1$, $R_2$ and n are as defined in connection with formula IIIa), with the proviso that, in formula IV, at least 10 mol % of the radicals $W_1$ that are not present in the end groups X and Y represent a group of formula in which $R_1$, $R_2$ and $R_3$ are as defined above.

The acid number of the acrylate component a) [mg of KOH needed to neutralise 1 g of acrylate] that characterises the number of free carboxyl groups should be at least 25 prior to the reaction with ammonia or an amine so as to ensure good properties of the composition with respect to water-solubility and developability in aqueous-alkaline solutions. Even better, and therefore preferred, are acid numbers over 60.

The reaction of the carboxyl groups with ammonia or the amines leads to the formation of the corresponding ammonium or amine carboxylates by a neutralisation reaction. These relatively ionic carboxylate groups cause the acrylates to dissolve or disperse readily in water. However, when such compositions are subjected to a thermal treatment, as when drying a coating of the composition or in the thermal cure of such a coating, the ammonium carboxylate groups can decompose again and the base volatilises.

A whole host of amines is suitable for reacting the carboxyl groups of the acrylates. All types of amines are suitable, typically including primary, secondary and tertiary amines as well as N-heterocyclic amines. Restriction of choice is imposed only in that the acrylates containing the carboxyl groups reacted with the amines must be water-soluble. The organic radicals attached to the amino nitrogen should therefore preferably contain only relatively few carbon atoms. The organic radicals of the amines will preferably carry substituents that promote solubility in water, typically hydroxyl groups. Suitable amines typically include lower alkylamines such as monomethylamine, dimethylamine and trimethylamine, corresponding pure ethylamines, propylamines and butylamines, and also mixed amines containing the cited radicals. Very suitable amines are also alkanolamines such as ethanolamine, dimethylethanolamine, diethanolamine, triethanolamine or 2-ami-no-2-methyl- 1,3-propanediol. Aromatic amines such as aniline may also suitably be used. Morpholine may be taken as illustrative of an amino nitrogen-containing heterocycle. Ammonia is preferred.

Suitable amines may further be divided into two groups on the basis of their volatility and their boiling point. The first group comprises amines which, compared with water, are fairly volatile, for example those which, at the same temperature, have a lower evaporation number or a higher vapour pressure than water. In general, such amines are those having boiling points below about 80° C. The second group comprises amines that are less volatile than water and usually have boiling points above 100° C. Illustrative examples are dimethyl ethanolamine, diethanolamine, triethanolamine or 2-amino-2-meth-yl- 1,3-propanediol.

A film formed by applying a composition based on amines of the first group can be dried in the temperature range from c. 70–100° C. in which the ammonium carboxylate groups of the acrylate decompose again and the free amine substantially volatilises from the dry composition. Owing to the reformation of free carboxyl groups of the acrylate, these compositions are soluble in aqueous alkali. Preferred novel compositions are accordingly those in which the carboxyl groups are reacted with amines and which are so chosen that they volatilise again at least at the temperature that is applied for forming a film of the radiation-sensitive composition from the photopolymer solution.

On the other hand, the ammonium carboxylate groups (of the film-forming acrylate) of the novel compositions based on less volatile amines decompose at the temperatures advantageously chosen for drying said compositions to a minor degree at most. Owing to the large number of ionic or strongly polar ammonium carboxylate radicals still therefore present in such films, these films are soluble in water.

It is, of course, also possible to obtain water-soluble films of compositions based on ammonia or the relatively volatile amines of the first group if correspondingly mild drying methods are used in which ammonium carboxylate radicals are unable to decompose.

As photoinitiators suitable as component b) it is possible to use all known types that are photosensitive and form radicals and which can be emulsified into the photopolymerisable composition.

If desired, additional co-initiators and/or stabilisers can be used.

Suitable examples of photoinitiators are aromatic carbonyl compounds such as benzoin, benzoin alkyl ethers such as the isopropyl or n-butyl ether, α-substituted acetophenones, preferably benzil ketals such as benzil dimethyl ketal, or α-halogen-substituted acetophenones such as trichloromethyl-p-tert-butylphenyl ketone or morpholinomethyl-phenyl ketone, or dialkoxyacetophenones such as diethoxyacetophenone, or α-hydroxyacetophenones such as 1-hydroxycyclohexylphenyl ketone; or benzophenones such as benzophenone or bis(4-dimethylamino)benzophenone; or metallocene initiators such as ti-tanocene initiators, e.g. bis(π-methylcyclopentadienyl)bis(σ-pentafluorophenyl)titanium IV; or a stannan in conjunction with a photoreducible dye, for example trimethylbenzyl-stannan in conjunction with methylene blue or Bengal pink; or a quinone or a thioxanthone in conjunction with an amine that carries at one α-carbon atom at least one hydrogen atom, typically anthraquinone, benzoquinone or thioxanthone in conjunction with bis(4-dimethylamino)benzophenone or triethanolamine; or a thioxanthone, for example an alkyl- or halogen-substituted thioxanthone, e.g. 2-isopropylthioxanthone or 2-chlorothioxanthone; or acylphosphine oxides or bisacylphosphine oxides.

Useful photoinitiators of the kind referred to above are Irgacure 907® and Quantacure ITX®, also Irgacure 369®, Irgacure 651® and Luzirin TPO®. Irgacure 907® and Quantacure ITX® are preferred.

The novel compositions may typically contain as further components c):

Thermal hardeners in amounts of c. 1 to 20% by weight, e.g. N-methylolacrylamide, epoxy resins, blocked isocyanates and melamine resins;

pigments or water-insoluble dyes in amounts of c. 0.1 to 2% by weight, e.g. Microlith blue 4G, Orasol blue GN and Irgalite green GLN;

water-compatible, organic and inorganic fillers in amounts of c. 5 to 15% by weight, e.g. talcum, quartz ($SiO_2$), barium sulfate ($BaSO_4$), aluminium oxide and calcium carbonate, with which the properties of a coating, including their heat-resistance, adhesion or scratch-resistance, can be enhanced;

additives for aqueous coating compositions (coating additives) in a total amount of c. 0.1 to 5% by weight, e.g. antifoams (e.g. Byk 80), adhesion promoters (e.g. benzotriazole), fungicides, thixotropic agents, and additionally up to 15% of an organic solvent such as methoxypropanol, methoxypropyl acetate and butyl glycol.

Component d) of the novel compositions is water as essentially sole solvent and/or emulsifier. However, the compositions may contain, in addition to water as component d), up to 15% by weight of an organic solvent, if the-components used for the compositions are dissolved/emulsified in such solvents. Water then forms the balance to make up 100%.

The water content of the compositions is governed substantially by the desired solids content of the composition. Preferred compositions contain about 40 to 80% by weight of water and are usually emulsions or dispersions.

The photopolymerisable compositions may contain as optional component e) at least one (meth)acrylate monomer or oligomer, conveniently in an amount from 5 to 50% by weight, based on component a). Such compounds may suitably be:

1) mono(meth)acrylates, 2) di(meth)acrylates, 3) poly(meth)acrylates having a functionality of at least 3.

Component 1) of the novel compositions may typically be selected from the following compounds: allyl acrylate, allyl methacrylate, methyl (meth)acrylate, ethyl (meth)acrylate, n-propyl (meth)acrylate, n-butyl (meth)acrylate, isobutyl (meth)acrylate, n-hexyl (meth)acrylate, 2-ethylhexyl (meth) acrylate, n-octyl (meth)acrylate, n-decyl (meth)acrylate and n-dodecyl (meth)acrylate, 2-hydroxyethyl (meth)acrylate, 2- and 3-hydroxypropyl (meth)acrylate, 2-methoxyethyl acrylate, 2-ethoxyethyl acrylate and 2- or 3-ethoxypropyl acrylate, tetrahydrofurfuryl methacrylate, 2-(2-ethoxyethoxy)ethyl acrylate, cyclohexyl methacrylate, 2-phenoxyethyl acrylate, glycidyl acrylate and isodecyl acrylate. Such products are likewise known and some are commercially available, for example from the SARTOMER Company.

Component 2) may suitably be selected from the diacrylate and dimethacrylate esters of aliphatic or cycloaliphatic diols, including 1,3-butylene glycol, 1,4-butanediol, neopentyl glycol, 1,6-hexanediol, diethylene glycol, triethylene glycol, tetraethylene glycol, polyethylene glycol 400, polyethylene glycol 600, tripropylene glycol, ethoxylated or propoxylated neopentyl glycol, 1,4-dihydroxymethylcyclohexane, 2,2-bis(4-hydroxycyclohexyl)propane or bis(4-hydroxycyclohexyl)methane, as well as the customary urethane acrylates, polyester acrylates or epoxy acrylates used for this purpose.

The following compounds may typically be used as component 3): 1,1,1-trimethylolpropane tri(meth)acrylate, ethoxylated 1,1,1-trimethylolpropane tri(meth)acrylate, pentaerythritol tetraacrylate, pentaerythritol monohydroxytri(meth)acrylate, dipentaerythritol monohydroxypenta(meth)acrylate. Such compounds are known and some are commercially available, as from the SARTOMER Company under the registered trademarks SR-295, SR-350, SR-351, SR-367, SR-399, SR-441 und SR-454, as well as the customary urethane acrylates, polyester acrylates or epoxy acrylates used for this purpose.

Suitable vinyl compounds that are crosslinkable with light are N-vinylpyrrolidone or N-vinylcaprolactam.

Because they do not contain additional polymolecular polymer binders, the compositions of this invention are aqueous photocurable compositions which, after drying, are non-tacky, have good electrical properties in a humid environment (relative humidity >80%) and a high photosensitivity, and do not give rise to electrolytic corrosion in a humid environment when a voltage is applied. As aqueous systems they are substantially environmentally safe, as not more than 15% of organic solvent is used The novel compositions can be prepared e.g. by mixing under stirring at room temperature components a), b) and d) and optional components c) and e) to a homogeneous solution or preferably to a homogeneous emulsion or dispersion.

The novel photopolymerisable compositions of this invention are used in particular as photoresist systems that are aqueous applicable and are used in particular for coating printed circuit boards. The novel compositions may conveniently be used as solder masks or as primary resists for the fabrication of, and/or for protecting, printed circuit boards. The coating on the substrate, preferably on a cleansed printed wiring board, may be applied by any known process under yellow light. The coated photocurable composition is afterwards dried in the air for about 1 to 10 minutes and then for about 5 to 20 minutes at 70–100° C. The coating can also be dried direct without air drying in an oven at 70–100° C.

The dried photocurable composition is then exposed through a photomask, preferably for about 5 to 100 seconds with a 5000 W mercury pressure lamp doped with metal halide and subsequently developed with an aqueous or, preferably, an aqueous-alkaline, solution, desirably with an only 1% aqueous-alkaline solution. The unexposed areas of the coating are removed and the exposed areas may then be heated for c.1 hour to effect a postcure of the coating.

Exposure of the novel composition is made with actinic light, usually UV and/or VIS radiation, preferably with light of a wavelength in the range from c. 220 to 550 nm, preferably from 220 to 450 nm. All per se known sources of radiation may be used for the exposure, typically mercury high-pressure lamps or UV/VIS lasers. The process parameters such as duration of exposure and distance from radiation source and radiation-sensitive layer will usually be dependent on the type of photosensitive composition and on the desired properties of the coating, and can be determined by those skilled in the art by routine experiments. The imagewise exposure can be made through a photomask or by writing direct with a laser beam on the photosensitive layer.

Exposure is followed by development. The unexposed areas of the photoresist can be removed by treatment with a developer solution. Very suitable developers for the layers processed in the practice of this invention are preferably aqueous solutions that must be alkaline when using (meth) acrylates if, in the course of drying, many free carboxyl groups have again formed in the coating. It is, however, also possible to use developers based on organic solvents, typically butyl diglycol, ethyl diglycol or γ-butyrolactone. As development is usually carried out in a closed tank, the danger of solvent emissions is only minimal.

Accordingly, the invention also relates to a process for the production of a photoresist image that comprises the following individual process steps: Applying the novel photopolymerisable composition to a substrate, removing the water and any solvent present from the composition to form a film of said photopolymerisable composition on the substrate, irradiating the coated substrate with actinic light in a desired pattern, removing the unexposed areas of the coating with an aqueous or aqueous-alkaline solution to expose the substrate and, if desired, subjecting the coating remaining on the substrate to a thermal cure and optional UV cure.

The preparation of the coated substrate can be effected by per se known methods with which a coating can be applied uniformly. Typical examples of such coating methods are spin-coating, screen printing, brushing, spraying, e.g. electrostatic spraying, reverse roller coating, dip coating and knife coating and curtain coating.

The add-on (layer thickness) and the type of substrate depend on the desired field of application. The novel compositions can be applied in relatively thin layers, preferably 5 to 150 μm, and give good resolution. In accordance with the radiation source and radiation-sensitive components, they are suitable for all fields of use in which it is desired to produce structured images.

The coatings of this invention also have excellent thermal resistance when they are brought into contact with hot liquid metals and/or alloys, as with a solder bath that will usually have a temperature of c. 270° C.

After exposure and development, the coating is subjected to an optional thermal aftertreatment or cure. This is done by heating to a temperature at which crosslinking can take place. The required temperature is usually in the range above 100° C., e.g. in the range from 120–180° C., preferably 120–150° C., over c. 1 hour. It may on occasion be useful to carry out an additional cure with UV radiation that can lead to an even more complete polymerisation of the (meth) acrylate monomers or oligomers. This may typically be done concurrently with a thermal cure.

Surprisingly, it has further been found that coatings of the inventive compositions on many substrates, e.g. on conventional printed wiring board laminates, are of particularly good quality if the substrate has previously been lightly moistened with water, as with a sponge or technically with a rubber roller. In this manner it is possible to achieve a particularly uniform spread and an extremely low tendency to bubble formation on drying. In a particularly preferred embodiment of the inventive process for the production of a coating, the substrate will therefore be moistened before application of the coating.

The invention is illustrated by the following non-limitative Examples.

EXAMPLE 1

A photopolymerisable composition is prepared by mixing the following components A and B at room temperature.

Component A is an organic phase (oil phase) and comprises:
- 31% by weight of the reaction product of epoxy cresol novolak ECN 1299 and acrylic acid, which has been esterified with succinic anhydride (acid number: 0.7 eq/kg, 70% in MPA (methoxypropyl acetate); acrylate component;
- 2.2% by weight of Irgacure 907®, 0.4% by weight of Quantacure ITX® as photoinitiator, as well as 7.2% by weight of micronised talcum and 0.2% by weight of Microlith blue 4G as additives.

Component B is an aqueous phase and comprises:
- 1.8% by weight of 25% aqueous ammonia,
- 2.0% by weight of N-methylolacrylamide as hardener, 0.1% by weight of benzotriazole as coating additive, 0.1% by weight of Byk 80 as antifoam, and
- 55% by weight of water.

Components A and B are mixed together, with stirring, to give a homogeneous, stable photoresist emulsion. Under yellow light, the aqueous photopolymerisable composition is applied to a cleansed printed wiring board with an applicator (c. 125 μ wet film thickness). The coating is dried for 10 minutes in the air and for a further 20 minutes at 80° C. Exposure is then made through a photomask for 20 seconds with a 5000 W metal halide mercury vapour lamp. Afterwards development is carried out with a 1% aqueous solution of sodium carbonate at about 30° C., such that the unexposed areas of the layer are dissolved out. The developed circuit board is heated for 1 hour to a temperature of 150° C. to effect a postcure of the residual coating.

The coated circuit board is dipped for 10 seconds in a hot solder bath of 270° C. No visible change is observed after soldering.

EXAMPLE 2

The following components A and B are processed as described in Example 1, unless otherwise indicated:

Component A:
- 31% by weight of the reaction product of epoxy cresol novolak resin ECN 1299 and acrylic acid, which has been esterified with tetrahydrophthalic acid (acid number: 1 eq /kg, 71% in MPA),
- 2.2% by weight of Irgacure 907®, 0.4% by weight of Quantacure ITX® as photoinitiator, as well as
- 7.2% by weight of micronised talcum and 3.5% by weight of epoxy phenol novolak resin EPN 1139 as component C and 0.2% by weight of Microlith blue 4G.

Component B:
- 2.4% by weight of 25% aqueous ammonia,
- 0.1% by weight of benzotriazole as coating additive, 0.1% by weight of Byk 80 as antifoam, and
- 52.9% by weight of water.

Test boards according to Standard IPC B-25 are coated with this composition. After the cure, the boards are subjected to an electrolytic corrosion test under the following conditions: 42° C., 90% relative humidity; 100 V voltage, 21 day continuous treatment.

The board shows no visible change or discolouration.

EXAMPLE 3

The same composition as in Example 1 is prepared, except that the epoxy resin is replaced with equal amounts of the advanced epoxy cresol novolak resin ECN 1299 [advanced with bisphenol A having an epoxy value of 4.1 eq/kg and then reacted with acrylic acid and subsequently esterified with succinic anhydride; acid number 0.9 eq/kg, prepared according to Example 3 of Swiss patent application 2004/93-2, filed on Jul. 2, 1993; tide "Epoxy acrylates"; concentrated to a solids content of 69%].

No visible change is observed after the solder test (10 sec at 270° C.).

EXAMPLE 4

The same composition as in Example 1 is prepared, except that the epoxy resin is replaced with equal amounts of a postglycidylated epoxy resin of bisphenol A [epoxy value 2.8 eq/kg; reacted with acrylic acid and subsequently esterified with succinic anhydride; acid number 0.9 eq/kg, prepared according to Example 15 of Swiss patent application 2003/93-0, filed on Jul. 2, 1993; title "Epoxy acrylates"].

The cured board is subjected to a cross-cut test according to DIN 46033. A zero value is obtained on the laminate as well as on the copper-clad laminate.

What is claimed is:

1. A method for coating a substrate comprising the step of applying to a substrate surface a photopolymerisable waterborne aqueous-alkaline developable coating composition comprising
   a) 20 to 80% by weight of a film-forming, acid group-containing acrylated derivative of an epoxy resin which is sufficiently neutralized with ammonia or an amine or an inorganic base to promote the formation of the corresponding ammonium or amine or inorganic base carboxylates by a neutralization reaction, at least 10% by weight of said component a) consisting of an acrylate which consists of a reaction product of i) a polymolecular bisphenol advanced epoxy resin with ii) an ethylenically unsaturated monocarboxylic acid, which reaction product is subsequently reacted with a cyclic anhydride of an organic polycarboxylic acid,
   b) 0.1 to 15% by weight of a photoinitiator,
   c) at least about 20% by weight of water to make up 100% by weight of the composition, or in addition to at least about 20% by weight of water, up to 15% by weight of an organic solvent, and
   d) 1 to 25% by weight of optional components, as well as
   e) one or more additional optional (meth)acrylate monomer or (meth)acrylate oligomer or a vinyl compound that can be crosslinked with light.

2. A method according to claim 1, wherein a thermal hardener and/or a pigment or a water-insoluble dye and/or a filler and/or a coating additive for aqueous coating compositions is employed as component d).

3. A method according to claim 1, wherein 2-methyl-1, 2-morpholinopropane-1 and/or isopropylthioxanthone is used as component b).

4. A method according to claim 1, wherein components a), b) and c), and optionally components d) and e) are mixed by stirring at room temperature to form a homogeneous emulsion or dispersion.

5. A method for coating a printed circuit board comprising the step of applying to the circuit board surface a photopolymerisable water-borne aqueous-alkaline developable coating composition, as solder resist, said coating composition comprising
   a) 20 to 80% by weight of a film-forming, add group-containing acrylated derivative of an epoxy resin which is sufficiently neutralized with ammonia or an amine or an inorganic base to promote the formation of the corresponding ammonium or amine or inorganic base carboxylates by a neutralization reaction, at least 10% by weight of said component a) consisting of an acrylate which consists of a reaction product of i) a polymolecular bisphenol advanced epoxy resin with ii) an ethylenically unsaturated monocarboxylic acid, which reaction product is subsequently reacted with a cyclic anhydride of an organic polycarboxylic acid, b) 0.1 to 15% by weight of a photoinitiator, c) at least about 20% by weight of water to make up 100% by weight of the composition, or in addition to at least about 20% by weight of water, up to 15% by weight of an organic solvent, and d) 1 to 25% by weight of optional components, as well as e) one or more additional optional (meth)acrylate monomer or (meth)acrylate oligomer or a vinyl compound that can be crosslinked with light.

6. A method according to claim 5, wherein a thermal hardener and/or a pigment or a water-insoluble dye and/or a filler and/or a coating additive for aqueous coating compositions is employed as component d).

7. A method according to claim 5, wherein 2-methyl-1, 2-morpholinopropane-1 and/or isopropylthioxanthone is used as component b).

8. A method according to claim 5, wherein components a), b) and c), and optionally components d) and e) are mixed by stirring at room temperature to form a homogeneous emulsion or dispersion.

9. A method for the fabrication of a printed circuit board comprising the step of applying to the circuit board surface a photopolymerisable water-borne aqueous-alkaline developable coating composition, as etch resist or as galvanoresist, said coating composition comprising a) 20 to 80% by weight of a film-forming, acid group-containing acrylated derivative of an epoxy resin which is sufficiently neutralized with ammonia or an amine or an inorganic base to promote the formation of the corresponding ammonium or amine or inorganic base carboxylates by a neutralization reaction, at least 10% by weight of said component a) consisting of an acrylate which consists of a reaction product of i) a polymolecular bisphenol advanced epoxy resin with ii) an ethylenically unsaturated monocarboxylic add, which reaction product is subsequently reacted with a cyclic anhydride of an organic polycarboxylic acid, b) 0. 1 to 15% by weight of a photoinitiator, c) at least about 20% by weight of water to make up 100% by weight of the composition, or in addition to at least about 20% by weight of water, up to 15% by weight of an organic solvent, and d) 1 to 25% by weight of optional components, as well as e) one or more additional optional (meth)acrylate monomer or (meth)acrylate oligomer or a vinyl compound that can be crosslinked with light.

10. A method according to claim 9, wherein a thermal hardener and/or a pigment or a water-insoluble dye and/or a filler and/or a coating additive for aqueous coating compositions is employed as component d).

11. A method according to claim 9, wherein 2-methyl-1, 2-morpholinopropane-1 and/or isopropylthioxanthone is used as component b).

12. A method according to claim 9, wherein components a), b) and c), and optionally components d) and e) are mixed by stirring at room temperature to form a homogeneous emulsion or dispersion.

* * * * *